(12) United States Patent
Rettger

(10) Patent No.: US 9,978,900 B2
(45) Date of Patent: May 22, 2018

(54) HELIOSTAT SYSTEM AND METHOD OF USING SAME

(75) Inventor: Philip Rettger, Moraga, CA (US)

(73) Assignee: ORMAT TECHNOLOGIES, INC., Reno, NV (US)

( * ) Notice: Subject to any disclaimer, the term of this patent is extended or adjusted under 35 U.S.C. 154(b) by 392 days.

(21) Appl. No.: 13/107,315

(22) Filed: May 13, 2011

(65) Prior Publication Data

US 2012/0285507 A1 Nov. 15, 2012

(51) Int. Cl.
| | |
|---|---|
| H01L 31/052 | (2014.01) |
| F24J 2/38 | (2014.01) |
| H01L 31/054 | (2014.01) |
| F24J 2/54 | (2006.01) |
| F24J 2/10 | (2006.01) |

(52) U.S. Cl.
CPC ............. *H01L 31/0547* (2014.12); *F24J 2/54* (2013.01); *F24J 2002/108* (2013.01); *F24J 2002/385* (2013.01); *Y02E 10/52* (2013.01)

(58) Field of Classification Search
CPC ............................ Y02E 10/47; H01L 31/0547
USPC ........................................... 136/246; 126/600
See application file for complete search history.

(56) References Cited

U.S. PATENT DOCUMENTS

| | | | | |
|---|---|---|---|---|
| 4,063,543 A | * | 12/1977 | Hedger | F24J 2/16 126/579 |
| 4,466,423 A | * | 8/1984 | Dolan et al. | 126/571 |
| 4,620,771 A | * | 11/1986 | Dominguez | 359/591 |
| 2004/0231715 A1 | * | 11/2004 | Pagel | 136/246 |
| 2004/0231716 A1 | * | 11/2004 | Litwin | 136/246 |
| 2005/0034751 A1 | * | 2/2005 | Gross et al. | 136/246 |
| 2011/0094565 A1 | * | 4/2011 | Banin et al. | 136/246 |
| 2011/0114080 A1 | * | 5/2011 | Childers et al. | 126/601 |

FOREIGN PATENT DOCUMENTS

WO    WO 2009152343 A1 * 12/2009

* cited by examiner

*Primary Examiner* — Sadie White
(74) *Attorney, Agent, or Firm* — Nath, Goldberg & Meyer; Jerald L. Meyer

(57) ABSTRACT

A heliostat includes a heliostat frame and a plurality of reflective surfaces, each reflective surface is movably mounted within the heliostat frame. The heliostat also includes a plurality of actuators, wherein each individual actuator of the plurality of actuators is associated with a single reflective surface of the plurality reflective surfaces and capable of moving the single reflective surface.

2 Claims, 6 Drawing Sheets

(FRONT VIEW)

(REAR VIEW)

(FRONT VIEW)

(REAR VIEW)

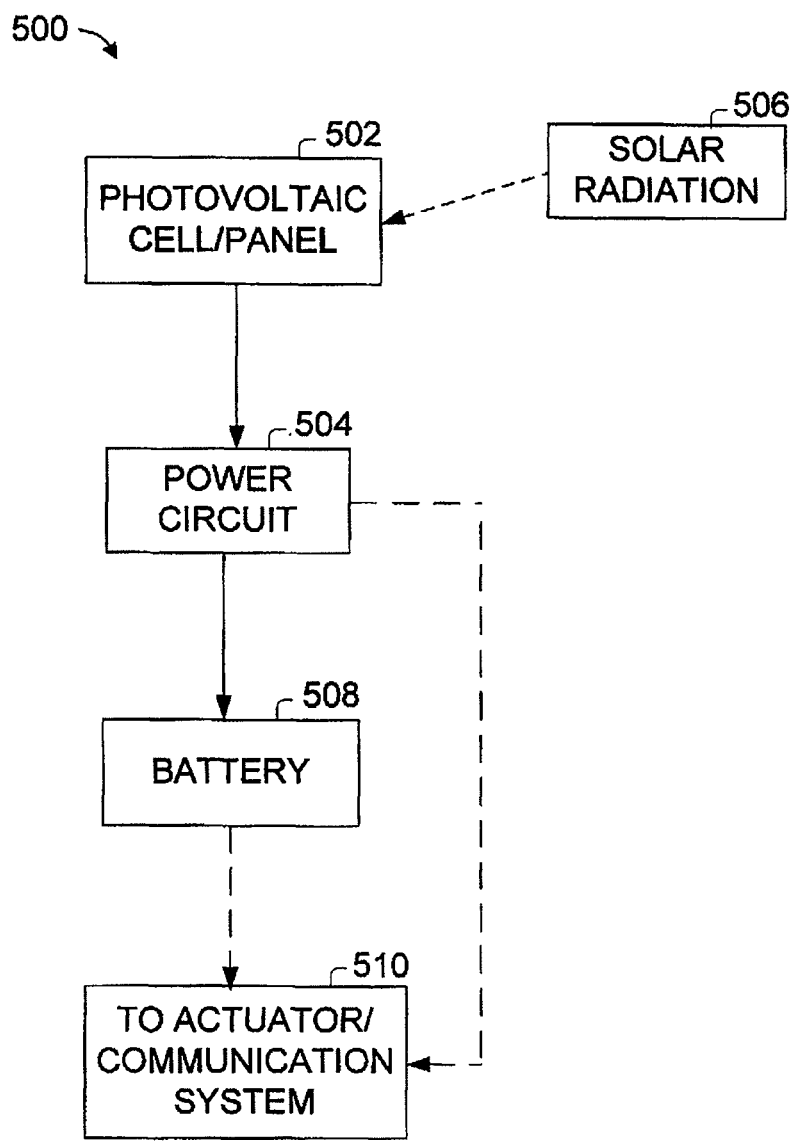
FIG. 5 (PV POWER GENERATOR)

HELIOSTAT SYSTEM AND METHOD OF USING SAME

BACKGROUND

The present subject matter relates to a heliostat system and a method of using the heliostat system. In particular, the present subject matter is directed to a heliostat system with reflective surfaces of a reduced size, each reflective surface having an individual actuator associated therewith in order to facilitate movement of the respective reflective surface.

In general, solar power generation involves the conversion of solar energy to electrical energy. This can be implemented through different technologies such as photovoltaics or heating a transfer fluid to produce vapor or hot gases to run a turbine generator, for example. In some solar power generation systems one or more heliostats may be used to reflect solar radiation onto a collection point to enhance overall efficiency. Typically, each heliostat is controlled to track the sun and maintain reflection of the solar radiation on the collection point throughout the day. The solar radiation received at the collection point may be converted using any known technology. Typical conversion methods include thermal conversion using solar-generated steam or other working fluids, or direct conversion to electricity using photovoltaic cells.

On larger scales, solar power generation from concentrated sunlight may employ fields of multiple heliostats for solar energy collection. Each heliostat typically requires power distribution in order to drive the motor positioners and data communication in order to facilitate sun tracking control. In a conventional heliostat field, the complete heliostat is moved according to the positioners, thus require relatively large amounts of energy since the heliostat is generally very heavy and large motors are needed to move them.

Furthermore, costs associated with laying cables to each heliostat over a large area are significant and site specific. These costs include trenching, conduit, wire, wire installation, and wire maintenance. Because solar power facilities extend over very large areas to capture more radiation, such trenching, conduit and wire runs are very long and thus expensive. Additionally, because each solar power facility must be designed for site-specific conditions, standardized site or cabling designs have not proven effective at reducing costs. Also, because soil conditions are often difficult to assess for an entire site (e.g., spanning many tens or hundreds of acres), unanticipated soil mechanics can quickly disrupt cost and schedule for a project. Finally, because solar power facilities are designed to operate over 30 or more years, infrastructure maintenance is also a significant economic consideration. Such geographically dispersed infrastructure is expensive to maintain, made worse when buried wiring is employed under the standard approach.

For a single large solar power plant (e.g., generating approximately 100 MW) the cost of building and maintaining this infrastructure would be in the millions of dollars. The solar power generation industry is revisiting heliostat-based architectures for cost-effective large-scale deployment. If heliostat-based architectures become the solution of choice, the annual savings from this subject matter could be very significant.

SUMMARY

The following presents a simplified summary in order to provide a basic understanding of some aspects of the claimed subject matter. This summary is not an extensive overview, and is not intended to identify key/critical elements or to delineate the scope of the claimed subject matter. Its purpose is to present some concepts in a simplified form as a prelude to the more detailed description that is presented later.

The present subject matter is directed to a heliostat comprising: a heliostat frame; a plurality of reflective surfaces, each reflective surface movably mounted within said heliostat frame; and a plurality of actuators; wherein each individual actuator of said plurality of actuators is associated with a single reflective surface of said plurality reflective surfaces and capable of moving said single reflective surface.

The present subject matter is also directed to a method of operating a heliostat comprising: reflecting solar radiation to a solar collection device using a plurality of reflective surfaces movably mounted within a heliostat frame; positioning each of said reflective surfaces using a plurality of actuators, individual actuators of said plurality of actuators being associated with single reflective surfaces of said plurality of reflective surfaces; controlling the actuators with a controller; converting solar radiation to electrical power using a photovoltaic panel; and supplying the electrical power to the controller and said plurality of actuators.

Furthermore, the present subject matter is directed to a heliostat comprising: a heliostat frame; a plurality of reflective surfaces, each reflective surface movably mounted within said heliostat frame; a plurality of actuators, each individual actuator of said plurality of actuators being associated with a single reflective surface of said plurality reflective surfaces and capable of moving said single reflective surface; a heliostat frame actuator, said heliostat frame actuator being capable of moving said heliostat frame from a first position to a second position; and a photovoltaic panel attached to said heliostat frame; wherein said each individual actuator is a low voltage actuator requiring only about 5-50 volts to move said single reflective surface; and wherein said each individual actuator is capable of moving said single reflective surfaces about a first axis and a second axis, said first axis and said second axis being arranged orthogonal to each other.

BRIEF DESCRIPTION OF THE DRAWINGS

FIG. 5 is a functional block diagram of an example of a local power supply in accordance with embodiments of the present subject matter.

DETAILED DESCRIPTION

Overview

Embodiments in accordance with the present subject matter address and mitigate the described economic issues and potentially eliminate all heliostat cabling and the costs associated therewith. A standardized hardware design can further simplify deployment activity and further mitigate site specific designs and the attendant risks and costs. Power and data distribution infrastructure can also be simplified and made more accessible compared with conventional distributed and buried infrastructure solutions so as to be more easily installed and maintained.

It is contemplated within the scope of the present subject matter that each reflecting surface within the heliostat system is movably mounted within a heliostat frame and each reflecting surface has an individual actuator associated with it in order to facilitate movement of the individual reflecting surface. In addition, the individual reflecting surfaces are of a size sufficiently small that only a low voltage actuator is needed in order to move the individual reflecting surface. By low voltage, it is meant that the voltage is from about 5 volts to about 50 volts. Thus, the size of each individual reflecting surface is limited to a size that can be moved by such a low voltage actuator.

In accordance with one non-limiting exemplary embodiment of the present subject matter, each heliostat in a solar power generation system may be equipped with one or more heliostat local infrastructure nodes (HELINs) that each combine a local power supply (e.g., a solar power supply) and a wireless communications data transceiver. The local power supply will further include energy storage. The power supply can operate using solar energy (separated from the overall solar power generation system) that is collected during the daylight hours to power positioning actuator motors, the controller circuitry, and the wireless data transceiver (e.g., a two-way communications device), thereby eliminating power wiring for the positioning mechanism motors and wireless data transceiver. The local energy storage can enable further operation of the heliostat when sunlight is unavailable. The wireless transceiver can be used to communicate commands and other telemetry between the heliostat and a central control station, thereby eliminating communication additional wiring. The local power supply may comprise solar energy collector such as a photovoltaic panel that may be mounted directly on the heliostat frame, incorporated within the heliostat frame or disposed nearby on the ground.

Figure 1:
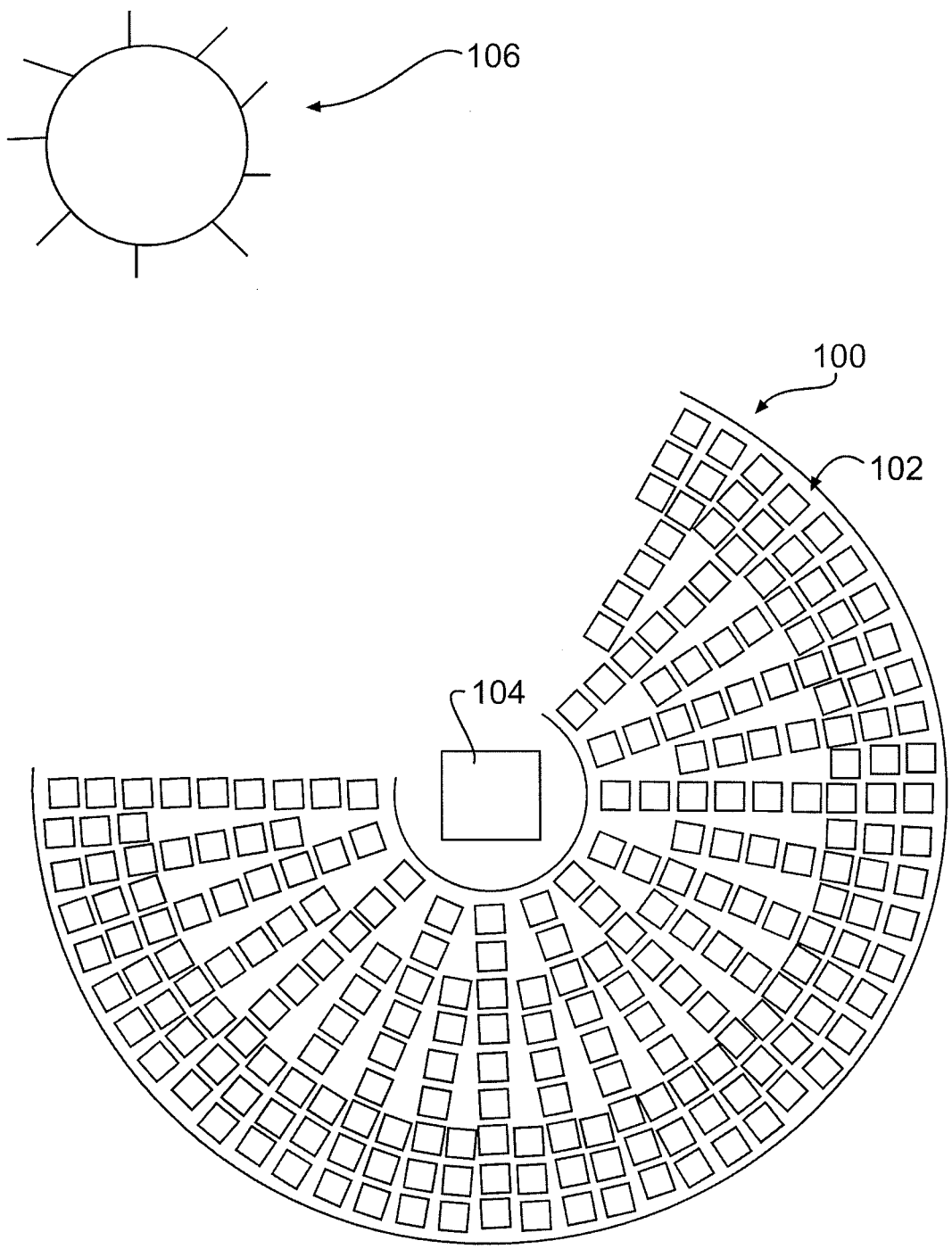
FIG. 1 is an illustration of an example heliostat field in which a plurality of heliostats are positioned to direct solar radiation to a collection point.

FIG. 1 illustrates a non-limiting example solar power generation system 100 employing a field of multiple heliostats 102 that may operate in accordance with embodiments of the present subject matter. The view shows the collection device 104, which in this non-limiting example comprises a central tower that receives solar radiation reflected from the encircling heliostats to a focal point near the top of the tower. The example system 100 shows a limited number of heliostats that receive solar radiation from the sun 106, however, those skilled in the art will appreciate that any number of heliostats may be used; the greater the number of heliostats, the more infrastructure savings can be expected. The reflected solar radiation heats a heat transfer fluid passing through the focal point of the collection device to drive a turbine generator to produce electrical power. Each of the heliostats 102 operates autonomously with its own power supply and actuator/controller and may also include a wireless communication device as described hereafter to track the sun and maintain reflecting the solar radiation throughout the day.

Different types of heliostat nodes and frames can take advantage of the reduced infrastructure in accordance with embodiments of the present subject matter. Some system designs (such as that described in FIG. 1) may employ heliostat nodes using a common collection device for all the heliostat nodes, a single device positioned to receive reflected solar radiation from all the individual reflective surfaces within the heliostat frames. In other system designs, each heliostat node may include an individual collection device for receiving the reflected solar radiation. For example, an individual collection device may comprise pipes affixed to the front of a parabolic reflector on each heliostat. In this case, piping is required to carry the heated fluid away to a turbine generator; however, this is probably not a cost effective approach. It is possible that each heliostat could have its own turbine generator but this, too, is probably not cost effective. In any case, both system types can benefit from eliminated infrastructure to support control and power of positioning of the heliostat nodes. Those skilled in the art will appreciate that the autonomous heliostat in accordance with the present disclosure may be used with almost any solar power generation system that requires sun tracking of one or more separate heliostats.

Heliostat for Solar Power Plants

Figure 2A:
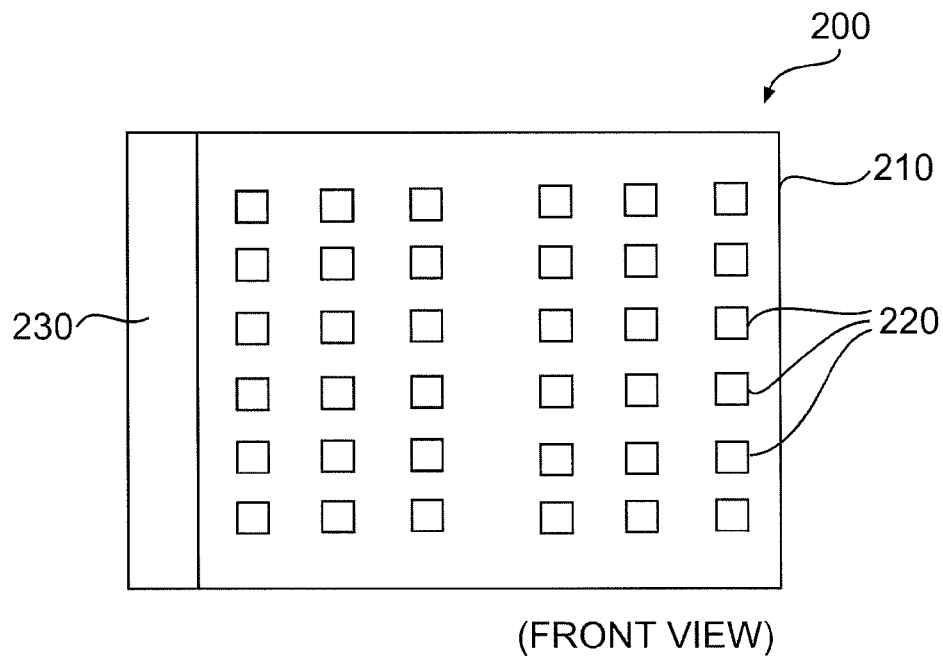
FIG. 2A is a schematic diagram of front view of a first embodiment of a heliostat of the present subject matter.

As is described above, the present subject matter is directed to an improved structure for heliostats used in large solar fields. FIG. 2A depicts a schematic diagram of a front view of a non-limiting embodiment of such a heliostat structure 200. Heliostat 200 includes heliostat frame 210, which is constructed to hold, or have mounted thereon, a plurality of individual reflecting surfaces 220. Each of plurality of reflecting surfaces 220 is mounted on or within heliostat frame 210 in a manner that allows each reflecting surface 220 to move relative to heliostat frame 210.

In one aspect of the present subject matter, each reflecting surface 220 is movable on or within heliostat frame 210 about a single axis. In another aspect of the present subject matter, each reflecting surface 220 is movable on or within heliostat frame 210 about two axes, with the two axes being orthogonal to each other.

Heliostat 200 also includes a photovoltaic (PV) panel 230, which uses solar radiation to generate electricity. The electricity generated by PV panel 230 can be used to run the actuators which move reflective surfaces 220, as well as any power needed for communicating the movement commands to the actuators. The electricity generated by PV panel 230 can also be used to power communications from a central coordinating system which maintains and monitors the heliostat systems.

Figure 2B:
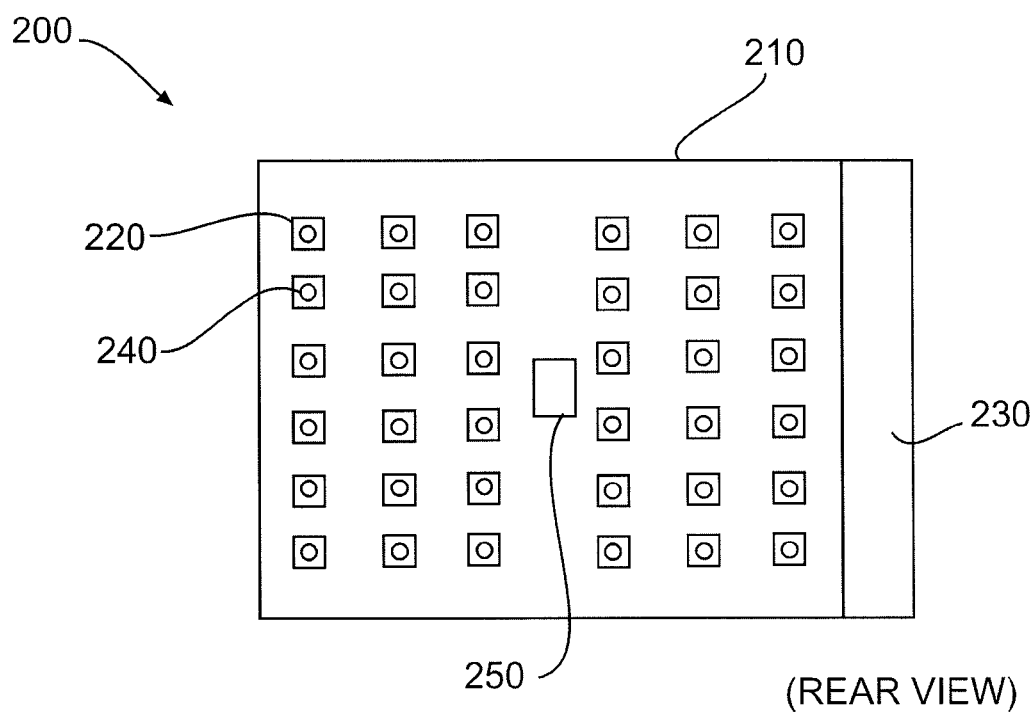
FIG. 2B is a schematic diagram of a rear view of the heliostat of FIG. 2A.

As previously indicated, an aspect of the present subject matter contemplates each reflective surface 220 having an individual actuator associated therewith. FIG. 2B depicts the rear view of heliostat 200 of FIG. 2A. As can be seen in FIG. 2B, each of plurality of reflective surfaces 220 has an individual actuator 240 associated therewith. The individual actuator 240 is able to move their respective reflective surface 220 in a direction about a first axis. It is also contemplated that the individual actuator 240 is capable of moving the associated reflective surface 220 about two axes, with each axis being orthogonal to the other. In a further aspect of the present subject matter, it is contemplated that individual actuator 240 is an actuator system. Within this aspect, the actuator system may be a single actuator that is capable of moving the respective reflective surface about a single axis. In an alternative aspect, the actuator system comprises two actuators that are capable of moving the respective reflective surface about two (2) axes, with each axis being orthogonal to each other. In a still further alternative aspect, the actuator system comprises three actuators that are capable of moving the respective reflective surface about two (2) axes orthogonal to each other. One of skill in the art would appreciate that, whenever "actuator" or "individual actuator" is used herein, it is contemplated that the actuator system is also contemplated for that particular embodiment.

FIG. 2B also shows heliostat frame actuator 250. An aspect of the present subject matter is that heliostat frame 210 may also be capable of moving in order to track the movement of the Earth with respect to the sun on a macro level. Movement of heliostat frame 210 is accomplished by heliostat frame actuator 250. Heliostat frame actuator 250 is capable of moving heliostat frame 210 from a first position to a second position. As will be understood, since the size and weight of heliostat frame 210 is much larger than the size and weight of individual reflective surfaces 220, heliostat frame actuator 250 may require a much more power than required for individual reflective surface actuators 240.

Again, as with FIG. 2A, FIG. 2B depicts PV panel 230 being attached to heliostat frame 210. In addition to generating electricity for powering actuators 240, any communications systems used to command movement of individual reflective surfaces 220 and communications for monitoring and maintaining control from the central control system, PV panel 230 is also capable of generating electricity used to run heliostat frame actuator 250.

While FIGS. 2A and 2B show PV panel 230 as being of a size equal to the height of heliostat frame 210, it is understood that this is being used only for non-limiting illustrative purposes, and that the present subject matter also contemplates that PV panel could be smaller in size or larger in size, depending on the electricity requirements of reflective surface actuators 240, heliostat frame actuator 250 and any communication system components being supplied electricity generated from PV panel 230.

It is an aspect of the present subject matter that each individual reflecting surface 220 within heliostat frame 210 reflects all of the solar radiation that it receives. Thus, since individual reflecting surfaces 220 are movable by individual actuators 240 on a micro level, the efficiency of each individual reflecting surface 220 is increased through each individual reflecting surface 220 being positioned to optimally reflect as much solar radiation as possible to the collection device. Also, as with individual actuators 240 being able to move individual reflective surfaces 220 along one or two axes of movement, so too, heliostat frame actuator 250 is capable of moving heliostat frame 210 along one or two axes of movement, with the individual axes being orthogonal to each other.

Figure 2C:
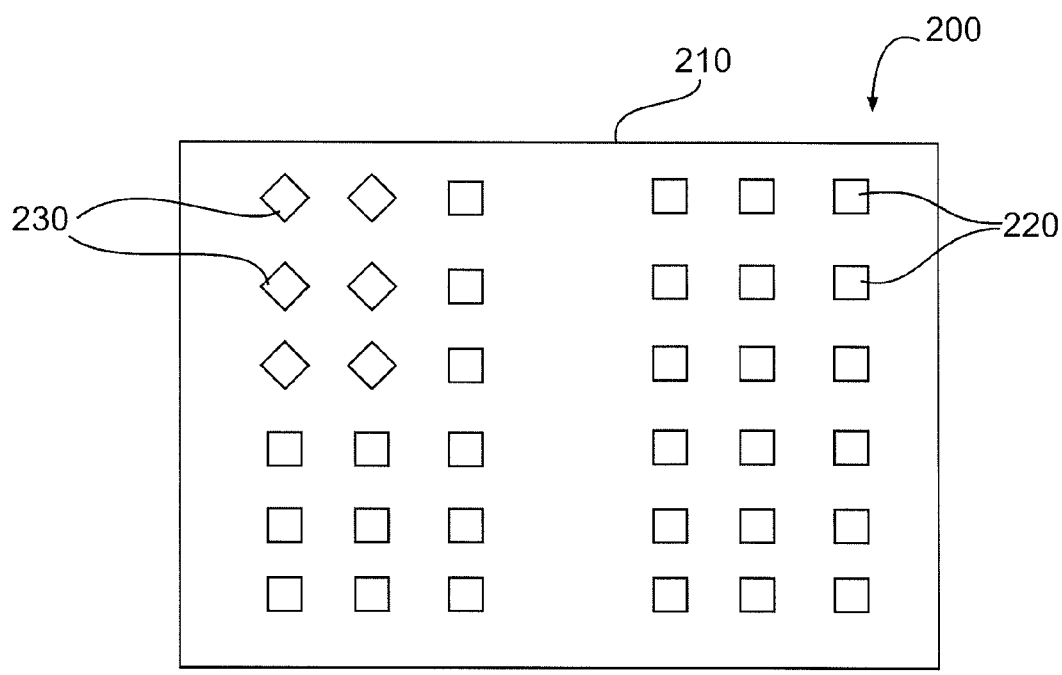
FIG. 2C is a schematic diagram of a front view of another embodiment of a heliostat of the present subject matter.

While FIGS. 2A and 2B show PV panel 230 being attached to heliostat frame 210, it is also possible to incorporate individual photovoltaic panels within heliostat frame 210, consistent with reflective surfaces 220 being incorporated within heliostat frame 210. FIG. 2C depicts a non-limiting example of a front view of heliostat 200 in which individual PV panels are incorporated within heliostat frame 210. As can be seen in FIG. 2C, a plurality of reflective surfaces 220 are mounted on or within heliostat frame 210. However, in this embodiment, a plurality of PV panels 230 is also individually mounted on or within heliostat frame 210. While FIGS. 2C (and 2D) show PV panels 230 being of similar size as reflecting surfaces 220, it is understood that this is only for illustrative purposes, and that PV panels 230 may be larger or smaller in size than reflecting surfaces 220.

Figure 2D:
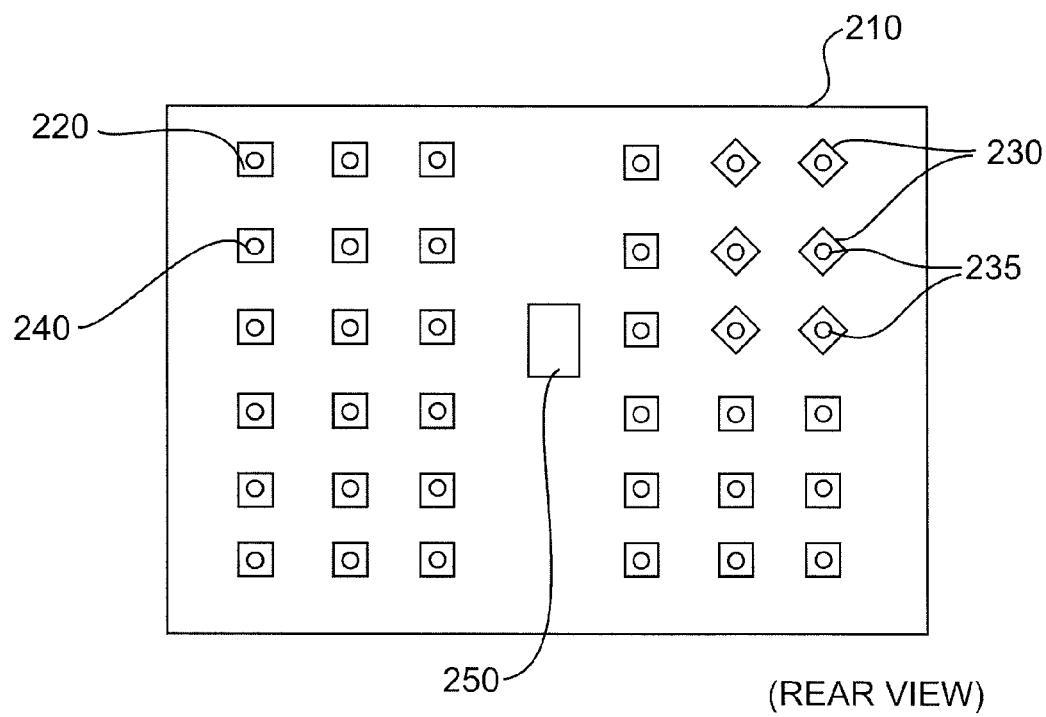
FIG. 2D is a schematic diagram of a rear view of the heliostat of FIG. 2C.

In order to optimize the use of PV panels 230 being incorporated within heliostat frame 210, PV panels 230 are movable with respect to heliostat frame 210. As with reflecting surfaces 220 being movable about one or two axes, PV panels 230 are also movable about one or two axes, with the axes being orthogonal to one another. Facilitation of the movement of PV panels 230 is done through individual PV panel actuators 235. FIG. 2D shows a rear view of the heliostat 200 embodied in FIG. 2C. As can be seen in FIG. 2D, each individual PV panel 230 has an associated individual PV panel actuator 235. PV panel actuator 235 is capable of moving PV panel 230, thus allowing for optimal positioning of PV panel 230 with respect to the position of the sun. Also in this non-limiting embodiment, it is understood that the size of the individual PV panel 230 is limited to the size movable by PV panel actuator 235, which is also a low voltage actuator as defined above with respect to reflective surface actuator 240 and heliostat frame actuator 250.

While FIGS. 2A-2D (as well as FIG. 4) show a 6×6 array of reflective surfaces and/or PV panels mounted on or within the heliostat frame, it is understood that the 6×6 array was selected only for illustrative purposes and is not meant to be limiting in any way. One of skill in the art will recognize that any size of array is usable within the scope of the contemplated subject matter. In addition, FIGS. 2A-2D illustrate an array wherein each reflective surface is set apart from the other reflective surfaces. It is understood that this illustration is also for ease of understanding and the individual reflective surfaces could be physically abutting each other so that there is no gap between the respective individual reflective surfaces. Furthermore, FIGS. 2A-2D show the photovoltaic panel being mounted on or within the heliostat frame. This, too, is for illustrative purposes, as it is further contemplated that the PV panel could also be located above the reflective surfaces or below/under the reflective surfaces. For the non-limiting example of the PV panels being located above the reflective surfaces, the PV panel will not be constructed so as to block all of the radiation, thereby allowing solar radiation to still reach the reflective surfaces. Likewise, if the PV panel is located behind/under the reflective surfaces, the reflective surfaces are comprised of dichromic mirrors that allow some of the solar radiation to pass through the reflective surface to reach the PV panel. In a further non-limiting example, the reflective surface and PV panel are incorporated into the same set of glass panels. In this example, the cells for the PV panel and the reflective aspects of the reflective surface are sandwiched between the same set of glass panels. In other words, in one portion of the area between the glass panels, the cells for the PV panel are situated, while in an adjoining portion of the same area between the glass panels, the reflective surfaces are located. This configuration would allow the individual actuator to move both the PV cells and the reflective surface in unison.

Reflective Surface Arrangement and Operation

Figure 3:
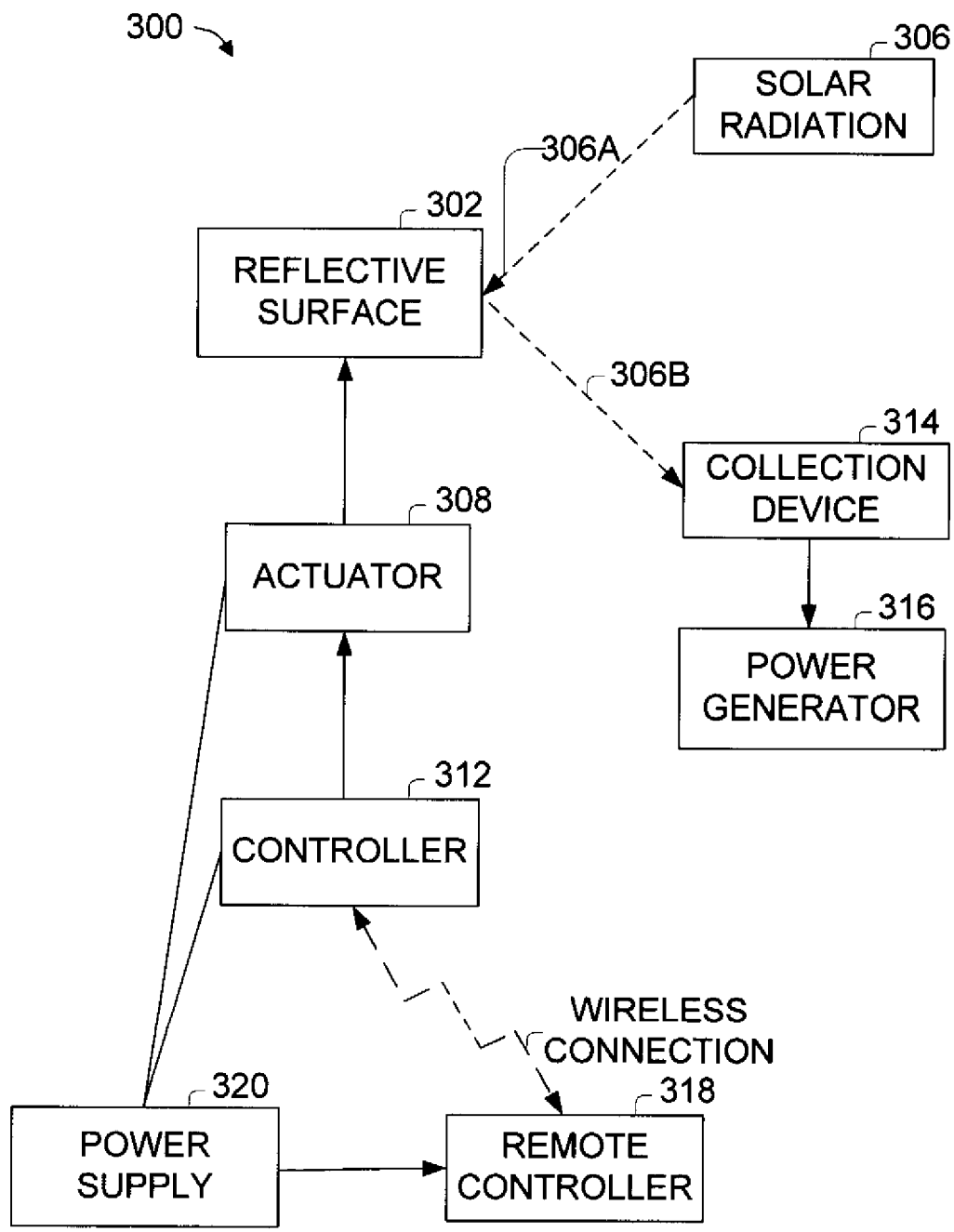
FIG. 3 is a functional block diagram of an example reflective surface arrangement operating in accordance with embodiments of the present subject matter.

FIG. 3 is a functional block diagram of a non-limiting example of an individual reflective surface arrangement 300 operating in accordance with embodiments of the present subject matter. The fundamental function of reflective surface arrangement 300 is to reflect received solar radiation 306A from solar radiation source (the sun) 306 off a reflective surface 302 to provide reflected solar radiation 306B to a collection device 314 which feeds a solar power generator 314. The reflective surface 302 is coupled to an actuator 308 that manipulates reflective surface 302 in order to track the sun 306 as it moves across the sky and maintain reflection of received solar radiation 306A. In an aspect of the present subject matter, actuator 308 may include two independent motor-driven angular positioning devices coupled in series that position about two substantially orthogonal axes, one for azimuth and one for elevation positioning. However, other types of actuators 308 may also be used. For example, a single axis actuator 308 may be used in some systems (possibly sacrificing some efficiency) and in other systems one or more additional positioning axes may be added (e.g., a rotation positioning device). In addition, each reflective surface 302 is capable of being moved independent of each other reflective surface 302. In other words, the individual actuator 308 moves the respective reflective surface 302 irrespective of the movement of any other reflective surface 302.

The type and position of collection device 314 depends upon the overall solar power generation system design. As discussed above, collection device 314 feeds solar power generator 316. Collection device 314 may be positioned to be fed by multiple autonomously operating heliostat systems as in the example system 100 of FIG. 1. Alternately, collection device 314 may be individual to each heliostat system, although this option is probably cost prohibitive. Embodiments of the disclosure are operable with almost any type of solar power generation system that uses one or more heliostats as will be understood by those skilled in the art.

Autonomous operation of the heliostat reflective surface 300 is afforded though the use of a solar power supply 320 local to each heliostat frame. Solar power supply 320 is separate from collection device 314 and solar power generator 316. Typically, solar power supply 320 will comprise a photovoltaic panel to convert further solar radiation to electrical power. (Note that the solar radiation received at reflective surface 302 is considered from the solar radiation received at power supply 320.) The electrical power is used to drive actuator 308 as well as the controller 312 and any wireless communication equipment described hereafter. In addition, the electrical power may be used to power communications to and from the heliostat from the central control system.

Actuator 308 is directed through controller 312 appropriate for the actuator 308 type and design. Controller 312 is a programmable device which may operate actuator 308 under closed loop control employing sensed position of each controlled axis of actuator 308 or under open loop control regularly updated against an absolute reference for each axis, e.g., a limit stop. Actuator 308 defines the orientation of reflective surface 302. When the heliostat system is installed, measurements are made to determine its orientation relative to the Earth and collection device 314 (unless collection device 314 is fixed to the heliostat frame, an option described above). Using this orientation information, proper positioning of reflective surface 302 only requires the addition of sun location information.

Sun location information is typically obtained from a number general techniques, sensing or calculation. A sun location sensor (not shown) may be employed to yield real-time information on the position of the sun. However, because the movement of the Earth relative to the sun is so well defined and predictable, it is also possible to predetermine a highly accurate sun location schedule. The only additional requirement to use the predetermined sun location schedule is precise timekeeping. Controller 312 may use sun location information from the sun sensor, a predetermined sun location schedule, or a hybrid combination of both types of sun location information as will be understood by those skilled in the art. For example, solar position calculation algorithms have been made publicly available by the National Renewable Energy Laboratory and others as will be understood by those skilled in the art. In addition, a hybrid control system using both sun sensing and a predetermined position calculation can be found in I. Luque-Heredia, et al, Inspira's CPV Sun Tracking, Photovoltaic Concentration, Springer Verlag, in press.

Controller 312 directs actuator 308 based on the current sun location information to properly orient reflective surface 302 to continuously reflect solar radiation 306A to collection device 314 throughout the day. The sun location information may be provided by a predetermined schedule programmed directly into controller 312. Alternately, or additionally, the heliostat may employ its own local sun sensor (not shown) to provide sun location information. In these two cases, the heliostat system operates autonomously in complete isolation. However, further embodiments of the disclosure may allow for some degree of outside control and monitoring over the autonomous operation of the heliostat system.

Positioning of the heliostat can also be accomplished using a laser sensor system. In this aspect of the subject matter, a laser is mounted on the heliostat frame and directed to the collection tower, where it hits a laser sensor. Based upon where the laser hits the sensor on the tower, the position of the heliostat can be calculated and adjustments made to the position of the heliostat if necessary. In a further aspect, the laser is a low power laser and the power to the laser can be supplied by the electricity generated by the local PV panel associated with the heliostat.

Remote control and monitoring of the heliostat system without additional wired infrastructure may be accomplished by including a wireless communications device in controller 312 for establishing a two-way communications link between controller 312 and a remote system controller 318. Typically, remote system controller 318 provides a centralized control of all the heliostat systems operating in the field. All functions of the heliostat system can be directed over the two-way communications link. Remote system controller 318 may also receive information regarding the operational status (e.g., status of the power supply 320, actuator 308, controller 312) from each of the heliostat systems over the two-way communications link, so that problems can be identified without requiring a technician to visit each heliostat system first.

Remote system controller 318 may transmit the sun location information to controller 312 of each heliostat system. In this case, if the sun location information is derived from a sensor, the sensor may be a single sensor employed for all the heliostat systems. For extremely high precision, the sun location information from the single sensor or the predetermined sun location schedule may be adjusted for each heliostat system based on its individual location relative to the sensor or the location basis for the schedule. This adjustment may be conveniently made within the controller for each heliostat system because it is simply an individual constant added to the received global data.

In one example embodiment of the disclosure, wireless communications is provided using an IEEE 802.11(g) Wi-Fi transceiver, with an antenna mounted collocated on the upper edge of the heliostat with the solar power supply (e.g., with the solar panel). Use of the 802.11(g) protocol allows many heliostats to be controlled from a single location while limiting licensing, bandwidth-sharing, and multi-path interference issues. The wireless communications method may be any one of many other options known to the art. For example, some other applicable wireless communications standards that may be employed include 802.11(a), 802.11 (b), ZigBee, or mesh networks. Any other suitable communication standard may also be employed as will be understood by those skilled in the art. The antenna may be located on the ground or possibly collocated with the solar panel. In some cases reliable RF data transmission over heliostat sized fields where signal blocking and RF interference could be significant should be mitigated as part of a routine development testing.

Heliostat System

Figure 4:
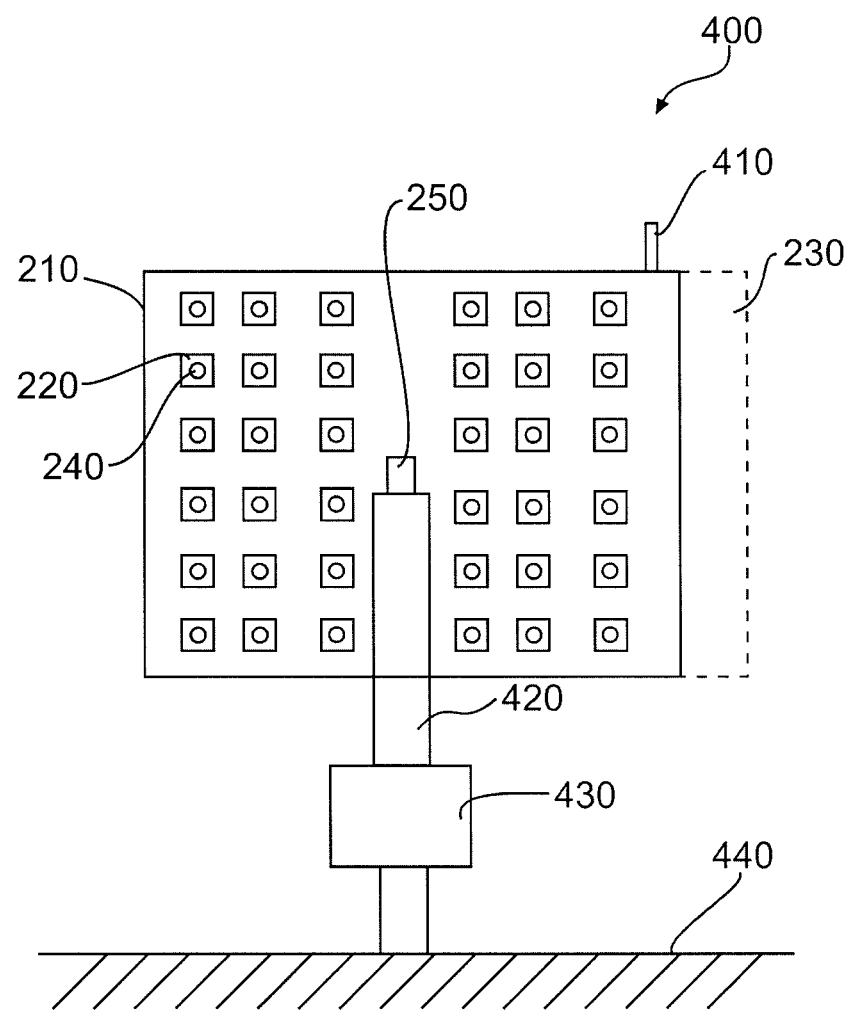
FIG. 4 is a schematic diagram of an example heliostat system in accordance with embodiments of the present subject matter.

FIG. 4 is a schematic diagram of a non-limiting example of a heliostat system 400 operating in accordance with embodiments of the present subject matter. It is noted that FIG. 4 depicts the rear view of heliostat system 400. In this exemplary embodiment, solar energy may be collected for the local solar power supply using flat-plate photovoltaic panel 230 attached to a side edge of heliostat frame 210. The large area of heliostat frame allows for a plurality of reflective surfaces 220 to be mounted on or within heliostat frame 210. Also depicted are a plurality of reflective surface actuators 240, each actuator 240 being associated with an individual reflective surface 220. Heliostat frame actuator 250 is coupled between heliostat frame 210 and a support post 420 and includes a drive and bearing assembly that manipulates the azimuth and elevation of heliostat frame 210. Heliostat frame actuator 250 is capable of moving heliostat frame 210 from a first position to a second position. Support post 410 includes an electronics housing 430 that includes all electronics associated with the operation of the heliostat system 400. For example, electronics housing 430 includes the controller electronics, motor drivers, photovoltaic power conditioning and battery for the local power supply and any wireless communications device. If a wireless communications device is employed, an antenna 410 (e.g., a 802.11(g) WiFi whip antenna) may be attached to the upper edge of heliostat frame 210 adjacent to photovoltaic panel 230 to improve reception. Finally, support post 420 may be mounted into the ground 440. As previously discussed, the heliostat system 400 is operable without any additional infrastructure; no cabling or other physical infrastructure needs to be coupled to the heliostat, or minimal cabling may be used to facilitate operation.

As is discussed herein, the size of the individual reflective surfaces (and, in some embodiments, of the photovoltaic panels) is selected such that a low voltage actuator is capable of moving the individual reflective surfaces. It is contemplated that the low voltage actuators will be operable with voltages as low as about 5 volts to about 50 volts. In an aspect of the present subject matter, the low voltage actuators are operable at any voltage between about 5 volts and about 50 volts (e.g., at 32 volts or at 19.5 volts). In addition, the actuator used to operate the heliostat frame on a macro level is much larger than the individual reflective surface actuators. This is necessary since the heliostat frame actuators must move a much larger mass.

Solar Power Supply

Another component of any autonomous heliostat embodiment of the present subject matter is an independent power supply, e.g., a solar power supply. There are some options in the implementation of the solar power supply. FIG. 5 illustrates an example local solar power supply 500 operating in accordance with typical embodiments of the present subject matter. Solar power supply 500 comprises a photovoltaic panel 502 which receives solar radiation 506. Photovoltaic panel 502 converts the received solar radiation 506 to electrical power which is coupled to a power circuit 504 for conditioning the electrical output of photovoltaic panel 502. The electrical output of power circuit 504 is coupled to battery storage 508 which is also connected to the controller and actuator 510 of the heliostat system. In an alternative aspect of the subject matter, power circuit 504 may provide the electrical output directly to the controller and actuator 510 of the heliostat system, thereby by-passing battery storage 508. Controller and actuator 510 in this example may also include the central system used for monitoring and maintaining the heliostat system.

In yet another exemplary embodiment of the present subject matter, some solar energy is stored using a battery. This stored energy is used when the sun is not providing enough power to directly power the desired load. For example, the storage may be sized to provide minimally fourteen hours of operation including the following functions: repositioning to the desired position before sunrise; monitoring wireless data transmission for commands; transmitting data required for status reporting; executing a number of commands that would be expected to position the heliostat off of a useful collecting attitude (e.g., for stowage or cleaning). Additionally, this battery storage allows tracking of the sun during transient cloud passage. The storage provided may be smaller or larger than that which is required for fourteen hours. The storage medium might also or instead utilize "supercapacitors" or might use any other suitable electrical power storage technologies known in the art.

Power for the actuators can be supplied by any of a variety of means. In a non-limiting aspect, power is supplied using a bus to which the actuators are connected. However, this requires additional hardware to be installed at the installation site. In another aspect, power is provided over wires. Since the power to the actuators is so low, the wires may be bare wires without causing undue danger to those installing the wires to connect the actuators.

In an alternative aspect of the present subject matter, it is contemplated that power to the actuators can be delivered via a "power over Ethernet" system. In this system, there is a collection of separate wires in a cable that provide power. The cable is also used to send and receive data to the controller and the actuator. In this embodiment, power is supplied in accordance with IEEE standard 802.3at, which is the standard for power over Ethernet. It is also contemplated that the power can be supplied in accordance with future revisions of the 802.3at standard or whatever replacement standard is developed for the 802.3at standard.

Operation of Heliostat System

The present subject matter is also directed to a method of operating a heliostat system. The method includes the steps of reflecting solar radiation to a solar collection device using a plurality of reflective surfaces movably mounted within a heliostat frame. Each of the reflective surfaces are positioned using a plurality of actuators, with individual actuators of the plurality of actuators being associated with single reflective surfaces of the plurality of reflective surfaces. In other words, there is a one-to-one correlation between the individual actuators and the individual reflective surfaces. This is understood to be the situation throughout the present subject matter as described above. The method of the present subject matter also includes controlling the actuators with a controller.

Other steps in the method of the present subject matter include converting solar radiation to electrical power using a photovoltaic panel or photovoltaic cell and supplying the electrical power to the controller and the plurality of actuators.

In other aspects of the present subject matter, the method includes other steps. The other steps may include positioning the heliostat frame using a heliostat frame actuator and supplying the electrical power to the heliostat frame actuator. In certain aspects of the method of the present subject matter, the photovoltaic panel comprises a plurality of photovoltaic cells movably arranged within the heliostat frame.

Furthermore, each individual actuator is a low voltage actuator requiring only about 5-50 volts to move the single reflective surface. Also, each individual actuator is capable of moving the single reflective surfaces about a first axis or about a first axis and a second axis, with the first axis and the second axis being arranged orthogonal to each other. Within this aspect and as previously described, the individual actuators can include an actuator system. The actuator system may be a single actuator that is capable of moving the respective reflective surface about a single axis. In an alternative aspect, the actuator system comprises two actuators that are capable of moving the respective reflective surface about two (2) axes, with each axis being orthogonal to each other. In a still further alternative aspect, the actuator system comprises three actuators that are capable of moving the respective reflective surface about two (2) axes orthogonal to each other. One of skill in the art would appreciate that, whenever "actuator" or "individual actuator" is used herein, it is contemplated that the actuator system is also contemplated for that particular embodiment.

While it is described above that each individual actuator requires only about 5-50 volts to move the single reflective surface, it is also contemplated within the scope of the present subject matter that each individual actuator is capable of being run at a higher voltage as well. In this aspect, it is contemplated that each individual actuator has a voltage that is the same as, lower than, or higher than, the voltage generated by the photovoltaic panel. In a non-limiting example, the photovoltaic panel is capable of generating from about 6 volts to about 1200 volts. Thus, each individual actuator could require the same, lower or higher voltage than the photovoltaic panel is capable of generating. If a voltage higher than can be generated by the photovoltaic panel is required, the additional voltage is supplied to each individual actuator from an outside source of power, for example from a battery.

Therefore, it will be understood that many additional changes in the details, materials, steps and arrangement of parts, which have been herein described and illustrated to explain the nature of the disclosure, may be made by those skilled in the art within the principal and scope of the disclosure as expressed in the appended claims.

What is claimed is:

1. A heliostat consisting of:
   a heliostat frame within which a plurality of reflective surfaces is mounted, said heliostat frame movable for receiving solar radiation using a heliostat frame actuator wherein said heliostat frame is moved from a first position to a second position such that each reflective surface receives solar radiation, wherein each reflective surface is movably mounted within said heliostat frame;
   a plurality of individual actuators located on said heliostat frame;
   wherein each individual actuator located on said heliostat frame of said plurality of individual actuators located on said heliostat frame is associated with a single reflective surface receiving solar radiation of said plurality of reflective surfaces for moving only the single reflective surface; and
   a laser sensor system comprising:
      a laser mounted on said heliostat frame; and
      a laser sensor mounted on a collection tower receiving a laser pulse from said laser;
   a photovoltaic panel attached to said heliostat frame for supplying power to said actuators and said heliostat frame actuator to move said frame; and
   a controller configured to control the movement of said plurality of reflective surfaces via said plurality of individual actuators such that each individual actuator located on said heliostat frame is associated with only a single reflective surface of said plurality of reflective surfaces mounted within said heliostat frame.

2. A heliostat consisting of:
   a heliostat frame movable for receiving solar radiation using a heliostat frame actuator within which a plurality of reflective surfaces is mounted such that each reflective surface receives solar radiation and is movably mounted within said heliostat frame, wherein said heliostat frame is moved from a first position to a second position;
   a plurality of individual actuators located on said heliostat frame, wherein each individual actuator of said plurality of individual actuators is associated with a single reflective surface receiving solar radiation of said plurality reflective surfaces for moving only the single reflective surface;
   a heliostat frame actuator, said heliostat frame actuator being capable of moving said heliostat frame from a first position to a second position;
   a photovoltaic panel attached to said heliostat frame for supplying power to said individual actuators and said heliostat frame actuator to move said frame;
   wherein said each individual actuator is a low voltage actuator requiring only about 5-50 volts to move said single reflective surface; and
   wherein said each individual actuator is capable of moving said single reflective surfaces about a first axis and a second axis, said first axis and said second axis being arranged orthogonal to each other;
   a laser sensor system comprising:
      a laser mounted on said heliostat frame; and
      a laser sensor mounted on a collection tower receiving a laser pulse from said laser; and
   a controller configured to control the movement of said plurality of reflective surfaces via said plurality of individual actuators such that each individual actuator located on said heliostat frame is associated with only a single reflective surface of said plurality of reflective surfaces mounted within said heliostat frame.

* * * * *